United States Patent
Laurent et al.

(10) Patent No.: US 10,772,190 B2
(45) Date of Patent: Sep. 8, 2020

(54) HEAT-REMOVAL ASSEMBLIES WITH OPPOSING SPRINGS

(71) Applicant: Apple Inc., Cupertino, CA (US)

(72) Inventors: Kristopher P. Laurent, Campbell, CA (US); Brett W. Degner, Menlo Park, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/865,156

(22) Filed: Jan. 8, 2018

(65) Prior Publication Data
US 2019/0104608 A1 Apr. 4, 2019

Related U.S. Application Data

(60) Provisional application No. 62/565,440, filed on Sep. 29, 2017.

(51) Int. Cl.
| | | |
|---|---|---|
| *H05K 1/02* | (2006.01) | |
| *G06F 1/20* | (2006.01) | |
| *H01L 23/40* | (2006.01) | |
| *H01L 23/367* | (2006.01) | |

(52) U.S. Cl.
CPC ............ *H05K 1/0203* (2013.01); *G06F 1/20* (2013.01); *H01L 23/40* (2013.01); *H01L 23/4006* (2013.01); *H01L 23/367* (2013.01)

(58) Field of Classification Search
CPC .. H05K 1/0203; H05K 7/20445; H05K 7/205; H05K 7/20436; H05K 7/20509; H05K 1/0201; H05K 1/0204; H05K 1/0209; H05K 1/021

USPC ................ 361/707, 711–713, 719, 720
See application file for complete search history.

(56) References Cited

U.S. PATENT DOCUMENTS

| | | | | |
|---|---|---|---|---|
| 6,549,418 B1 * | 4/2003 | Deeney | ................ | H05K 3/325 361/736 |
| 6,625,022 B2 * | 9/2003 | Frutschy | ............ | H01L 23/4006 165/104.33 |
| 6,657,131 B2 * | 12/2003 | Gonzalez | ................ | H01L 23/32 174/250 |
| 7,539,027 B2 * | 5/2009 | Callahan | .............. | H05K 7/1061 361/783 |

(Continued)

*Primary Examiner* — Jayprakash N Gandhi
*Assistant Examiner* — Stephen S Sul
(74) *Attorney, Agent, or Firm* — Dickinson Wright RLLP

(57) ABSTRACT

Heat-removal assemblies with springs on opposing sides of a support structure and methods for using the same are provided. Heat may be removed from a heat-generating assembly of an electronic device by a heat-removal assembly that may include a heat-dissipating subassembly (e.g., a heat spreader and/or a heat pipe) and a fastener subassembly. The fastener subassembly may be configured to press the heat-dissipating subassembly against the heat-generating assembly for enabling the heat-dissipating subassembly to be thermally coupled to the heat-generating assembly for removing heat therefrom. In order for the fastener subassembly to provide an even pressure distribution across the heat-dissipating subassembly for such heat removal and/or to limit deformation of one or more portions of the electronic device during such heat removal, the fastener subassembly may include two springs positioned on opposite sides of a circuit board that may be supporting the heat-generating assembly.

18 Claims, 10 Drawing Sheets

(56) References Cited

U.S. PATENT DOCUMENTS

| | | | | |
|---|---|---|---|---|
| 8,021,179 B1* | 9/2011 | Wertz | ............... | H05K 7/1007 |
| | | | | 439/331 |
| 2007/0236887 A1* | 10/2007 | Cheng | ............ | H01L 23/4006 |
| | | | | 361/700 |
| 2009/0305524 A1* | 12/2009 | Lin | .................. | H01R 12/714 |
| | | | | 439/68 |
| 2009/0305527 A1* | 12/2009 | Wertz | ............ | H01L 23/4006 |
| | | | | 439/71 |
| 2009/0311885 A1* | 12/2009 | Cheng | .................... | G06F 1/20 |
| | | | | 439/65 |
| 2010/0177477 A1* | 7/2010 | Cheng | .................... | G06F 1/20 |
| | | | | 361/679.47 |
| 2011/0110031 A1* | 5/2011 | Homer | .................. | G06F 1/20 |
| | | | | 361/679.54 |
| 2015/0262907 A1* | 9/2015 | Degner | ............. | H05K 1/181 |
| | | | | 361/679.47 |

* cited by examiner

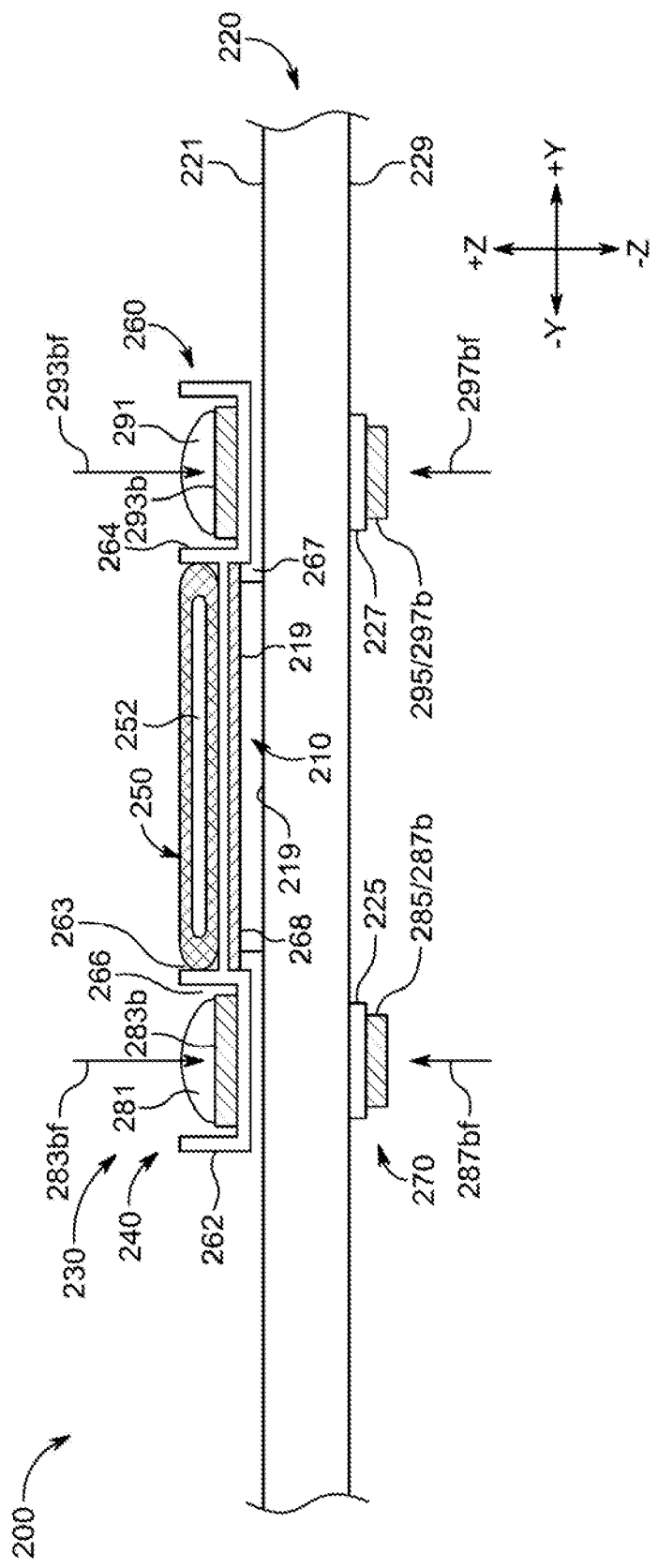

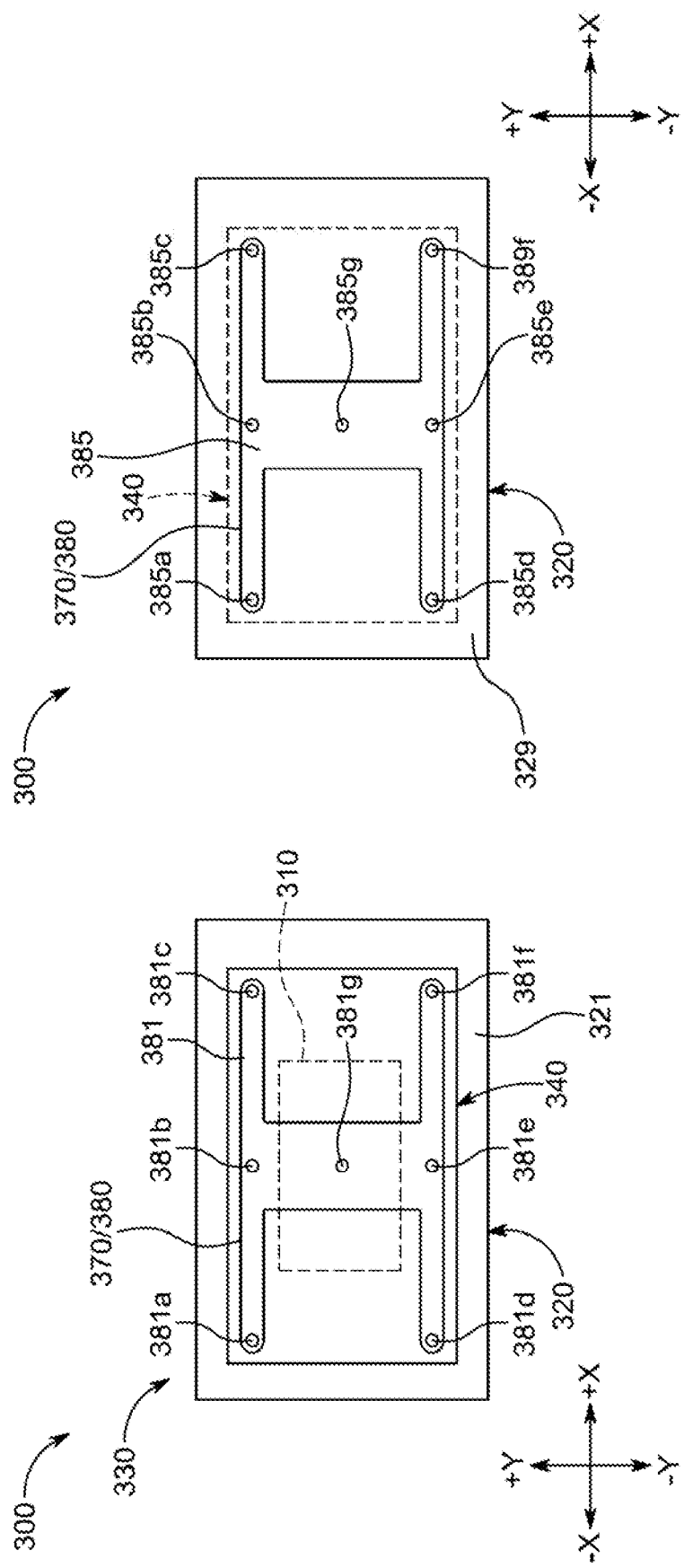

HEAT-REMOVAL ASSEMBLIES WITH OPPOSING SPRINGS

CROSS-REFERENCE TO RELATED APPLICATION(S)

This application claims the benefit of prior filed U.S. Provisional Patent Application No. 62/565,440, filed Sep. 29, 2017, which is hereby incorporated by reference herein in its entirety.

TECHNICAL FIELD

This disclosure relates to heat-removal assemblies and, more particularly, to heat-removal assemblies with springs on opposing sides of a support structure.

BACKGROUND OF THE DISCLOSURE

An electronic device (e.g., a laptop computer, a cellular telephone, etc.) may be provided with a heat-removal assembly for removing heat from a heat-generating assembly. However, heretofore, such a heat-removal assembly has been unable to effectively press against such a heat-generating assembly without deforming the electronic device.

SUMMARY OF THE DISCLOSURE

This document describes heat-removal assemblies with springs on opposing sides of a support structure and methods for using the same.

For example, an electronic device is provided that may include a circuit board including a top circuit board surface and a bottom circuit board surface, a heat-generating assembly positioned on the top circuit board surface, and a heat-removal assembly including a heat-dissipating subassembly and a fastener subassembly including a top spring including a top anchor portion and a top contact portion positioned above the top circuit board surface, a bottom spring including a bottom anchor portion and a bottom contact portion positioned below the bottom circuit board surface, and a coupling mechanism that couples the top anchor portion to the bottom anchor portion via a circuit board passageway extending through the circuit board between the top circuit board surface and the bottom circuit board surface, wherein the top contact portion exerts a top contact force for forcing a portion of the heat-dissipating subassembly towards a portion of the heat-removal assembly, and wherein the bottom contact portion exerts a bottom contact force for forcing a portion of the circuit board towards the heat-dissipating subassembly.

As another example, an assembly is provided for pressing a heat-dissipating assembly against a heat-generating assembly that is positioned on a first board surface of a board comprising a passageway between the first board surface and a second board surface, wherein the fastener assembly may include a first spring structure including a first spring anchor and a first spring contact, and second spring structure including a second spring anchor and a second spring contact, wherein the second spring anchor is fastened to the first spring anchor through the board passageway, wherein the first spring contact presses the heat-dissipating assembly towards the first board surface, and wherein the second spring contact presses the second board surface towards the heat-dissipating assembly.

As yet another example, a method is provided for using a heat-dissipating assembly and a spring assembly to remove heat from a heat-generating assembly positioned on a first support structure surface of a support structure that also includes a second support structure surface, wherein the method may include pressing, with the spring assembly, the heat-dissipating assembly towards the first support structure surface of the support structure, and pressing, with the spring assembly, the second surface of the support structure towards the heat-dissipating assembly.

This Summary is provided only to summarize some example embodiments, so as to provide a basic understanding of some aspects of the subject matter described in this document. Accordingly, it will be appreciated that the features described in this Summary are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The discussion below makes reference to the following drawings, in which like reference characters may refer to like parts throughout, and in which:

FIG. 2E is a cross-sectional view of the portion of the electronic device of FIGS. 2A-2D, taken from line IIE-IIE of FIG. 2C;

FIG. 3A is an assembled top plan view of a portion of yet another electronic device including a heat-removal assembly;

FIG. 3B is an assembled bottom plan view of the portion of the electronic device of FIG. 3A;

DETAILED DESCRIPTION OF THE DISCLOSURE

Heat-removal assemblies with springs on opposing sides of a support structure and methods of using the same are provided. Heat may be removed from a heat-generating assembly (e.g., any suitable electronic component or assembly) of an electronic device by a heat-removal assembly that may include a heat-dissipating subassembly (e.g., a heat spreader and/or a heat pipe) and a fastener subassembly. The fastener subassembly may be configured to press the heat-dissipating subassembly against the heat-generating assembly for enabling the heat-dissipating subassembly to be thermally coupled to the heat-generating assembly for removing heat therefrom. In order for the fastener subassembly to provide an even pressure distribution across the heat-dissipating subassembly for such heat removal and/or to limit deformation of one or more portions of the electronic device during such heat removal, the fastener subassembly may include two springs positioned on opposite sides of a circuit board that may be supporting the heat-generating assembly. An anchor portion of a first spring positioned on a first side of the circuit board may be fixed or fastened or anchored or otherwise coupled to an anchor portion of a second spring positioned on a second side of the circuit board, where such anchor portion coupling may be provided via a passageway through the circuit board between the first and second sides of the circuit board. A contact portion of the first spring may be configured to press or push or otherwise force the heat-dissipating subassembly towards the first side of the circuit board while a contact portion of the second spring may be configured to press or push or otherwise force the second side of the circuit board towards the heat-dissipating subassembly, which may facilitate robust thermal coupling between the heat-dissipating subassembly and the heat-generating assembly that may be positioned between the first side of the circuit board and the heat-dissipating subassembly.

Figure 1:
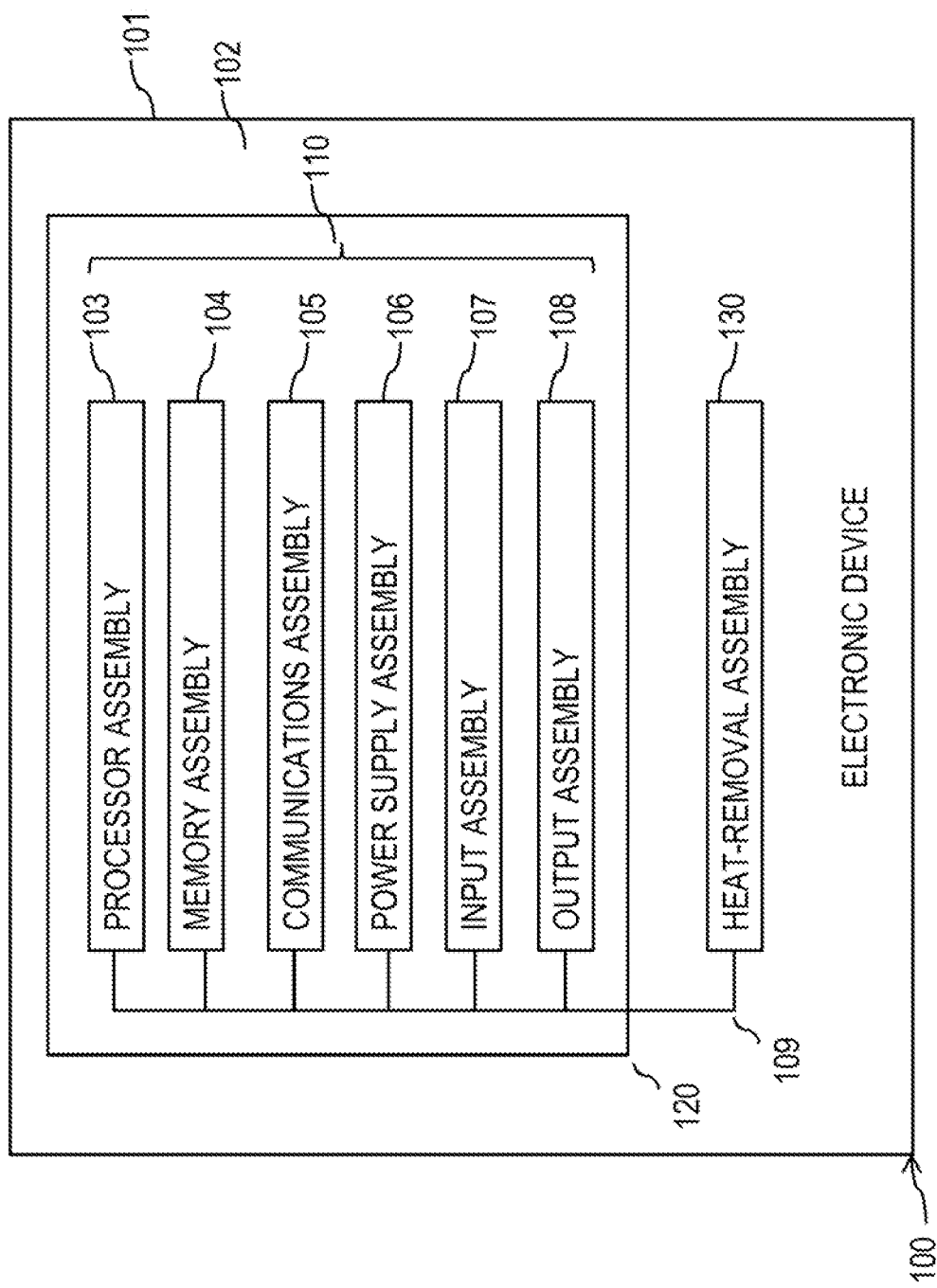
FIG. 1 is a schematic view of an illustrative electronic device including a heat-removal assembly.
Figure 2A:
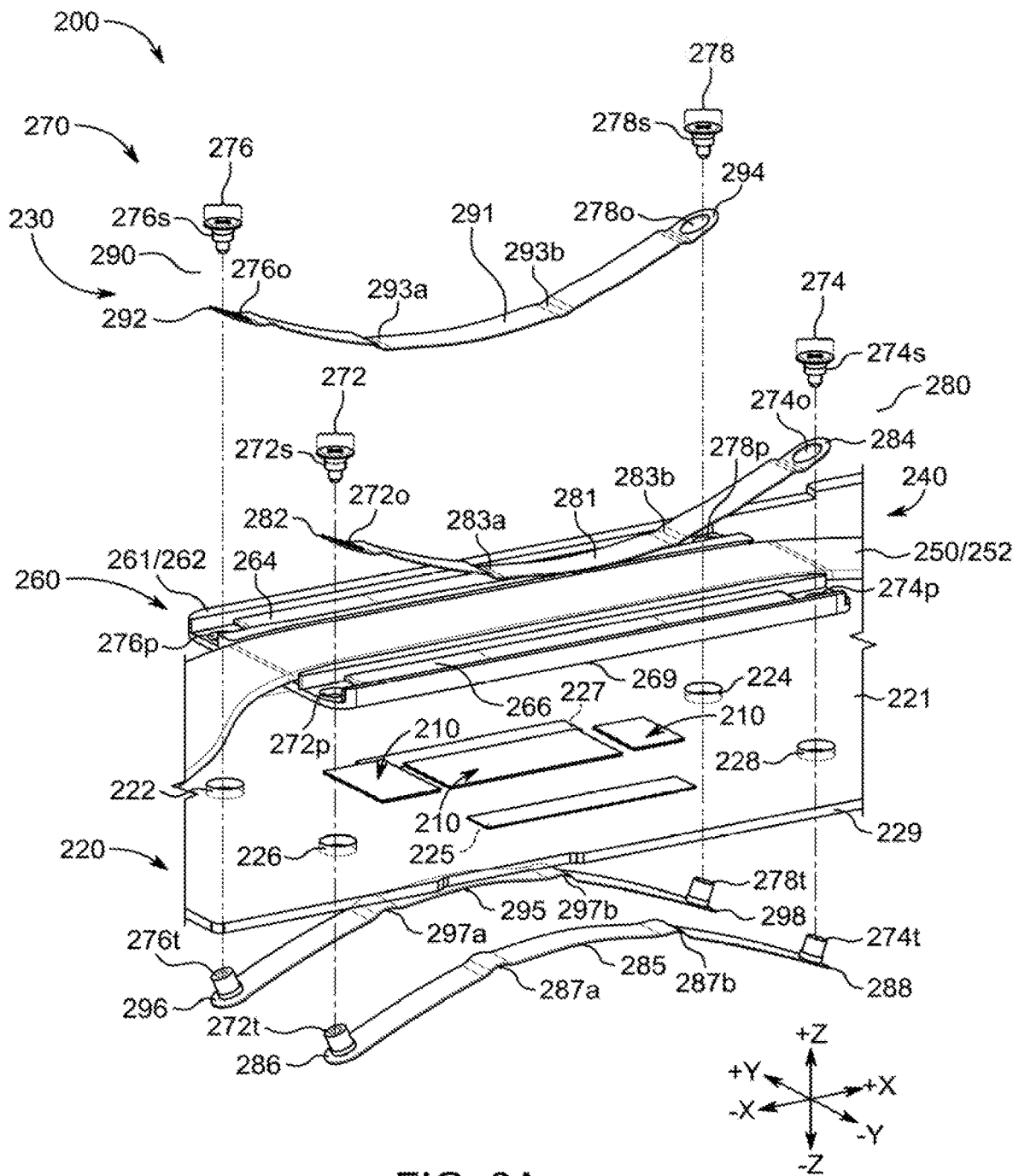
FIG. 2A is an exploded top perspective view of a portion of another electronic device including a heat-removal assembly.
Figure 2B:
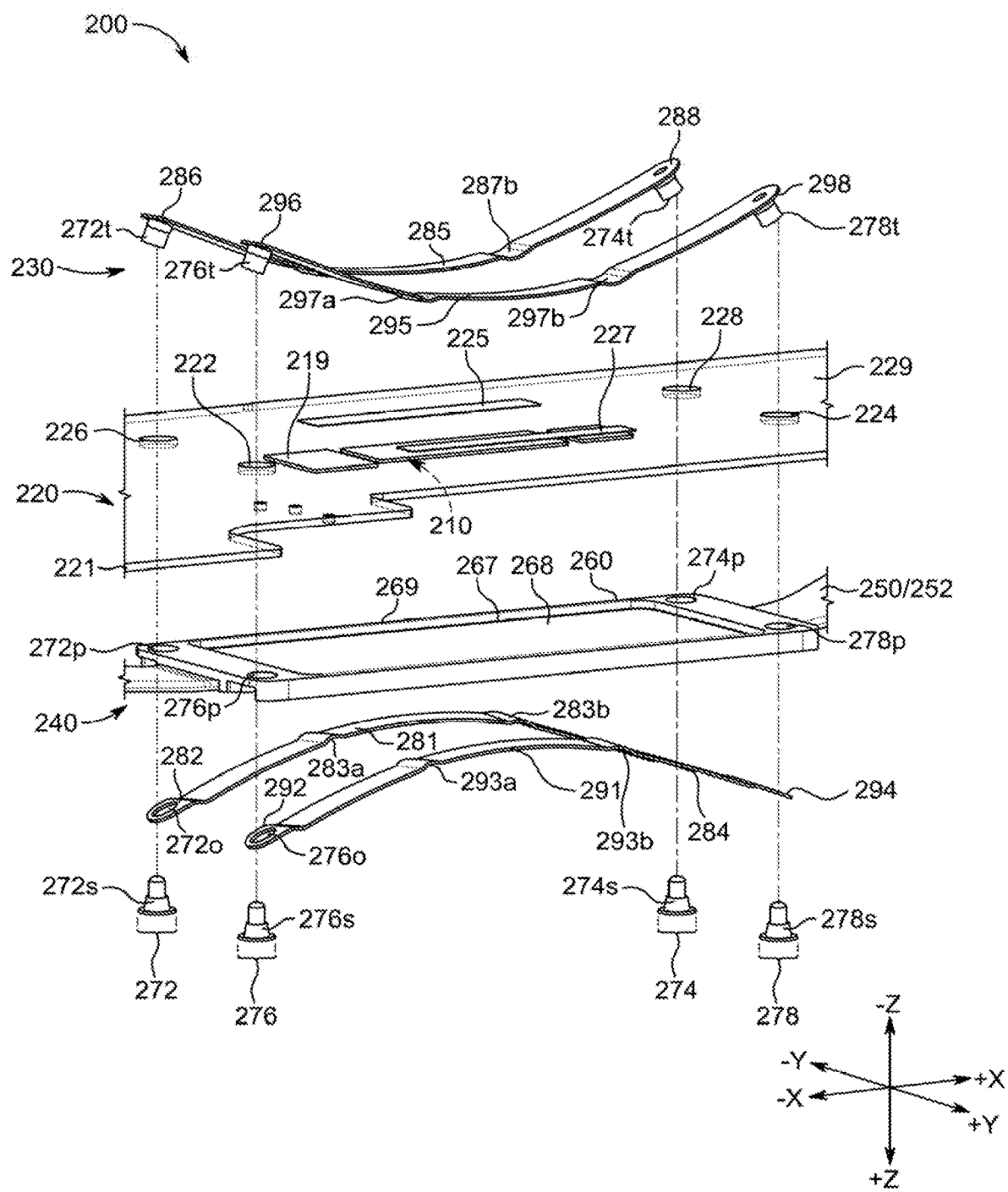
FIG. 2B is an exploded bottom perspective view of the portion of the electronic device of FIG. 2A.
Figure 2C:
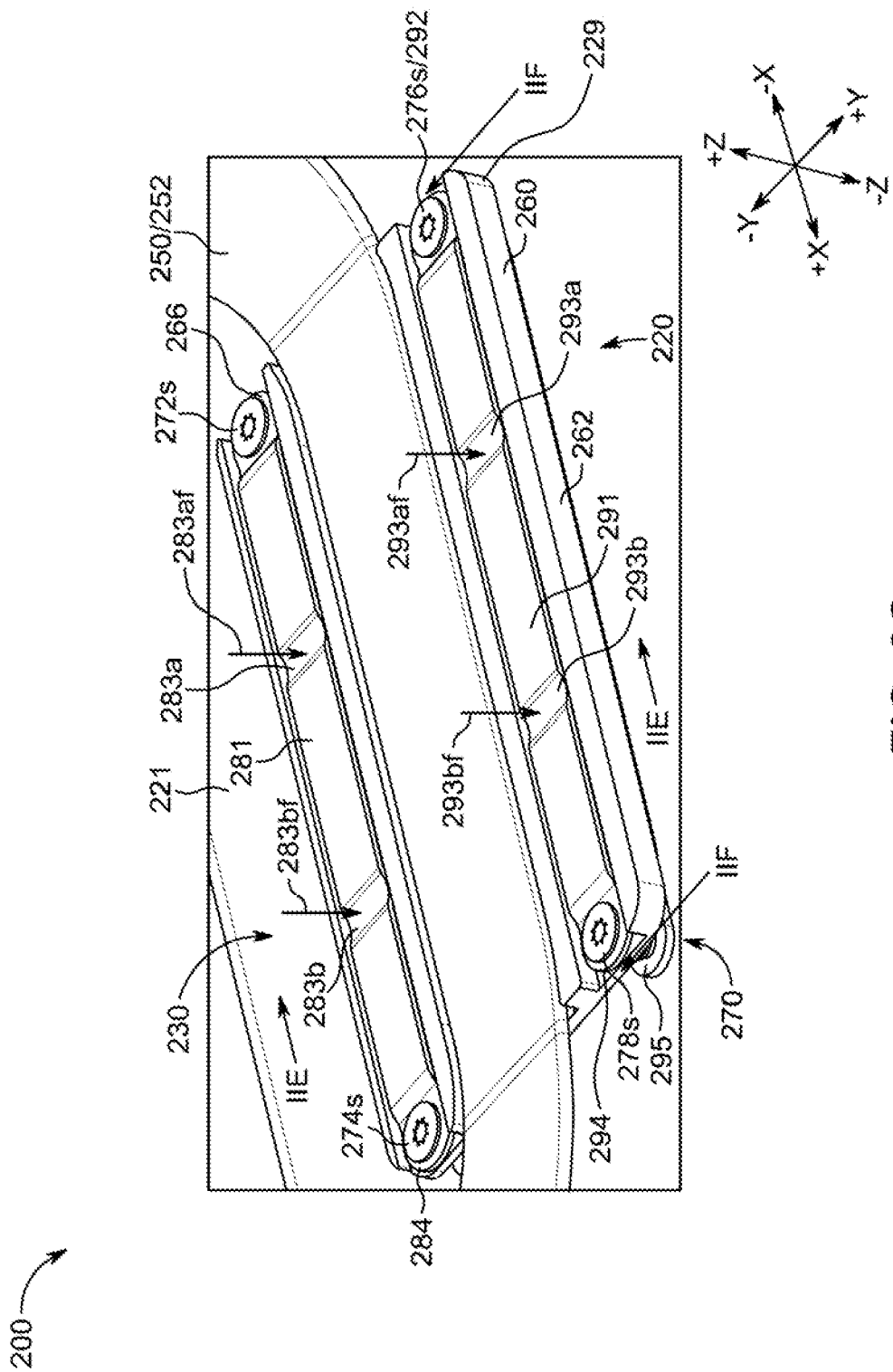
FIG. 2C is an assembled top perspective view of the portion of the electronic device of FIGS. 2A and 2B.
Figure 2D:
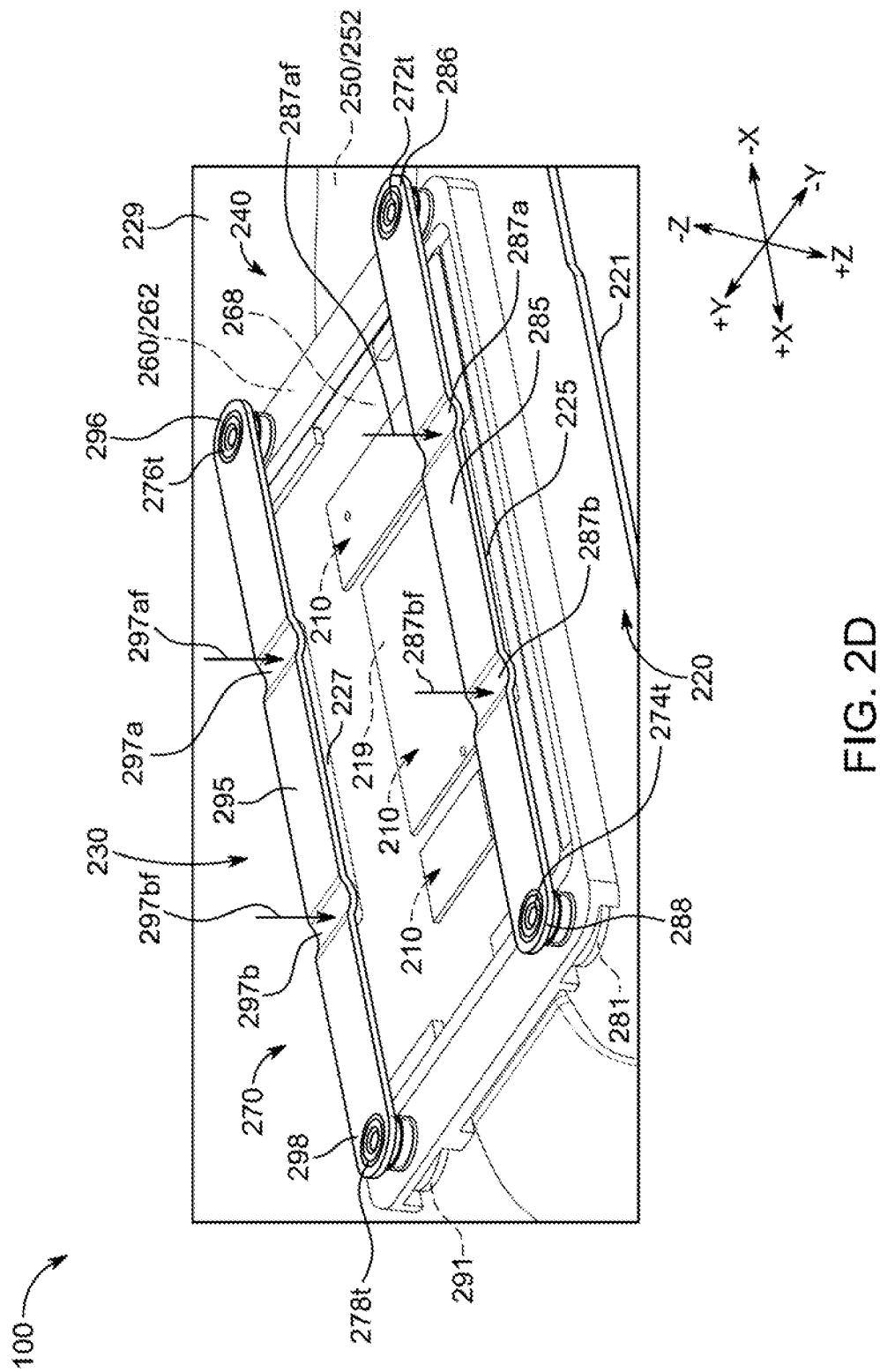
FIG. 2D is an assembled bottom perspective view of the portion of the electronic device of FIGS. 2A-2C.
Figure 2F:
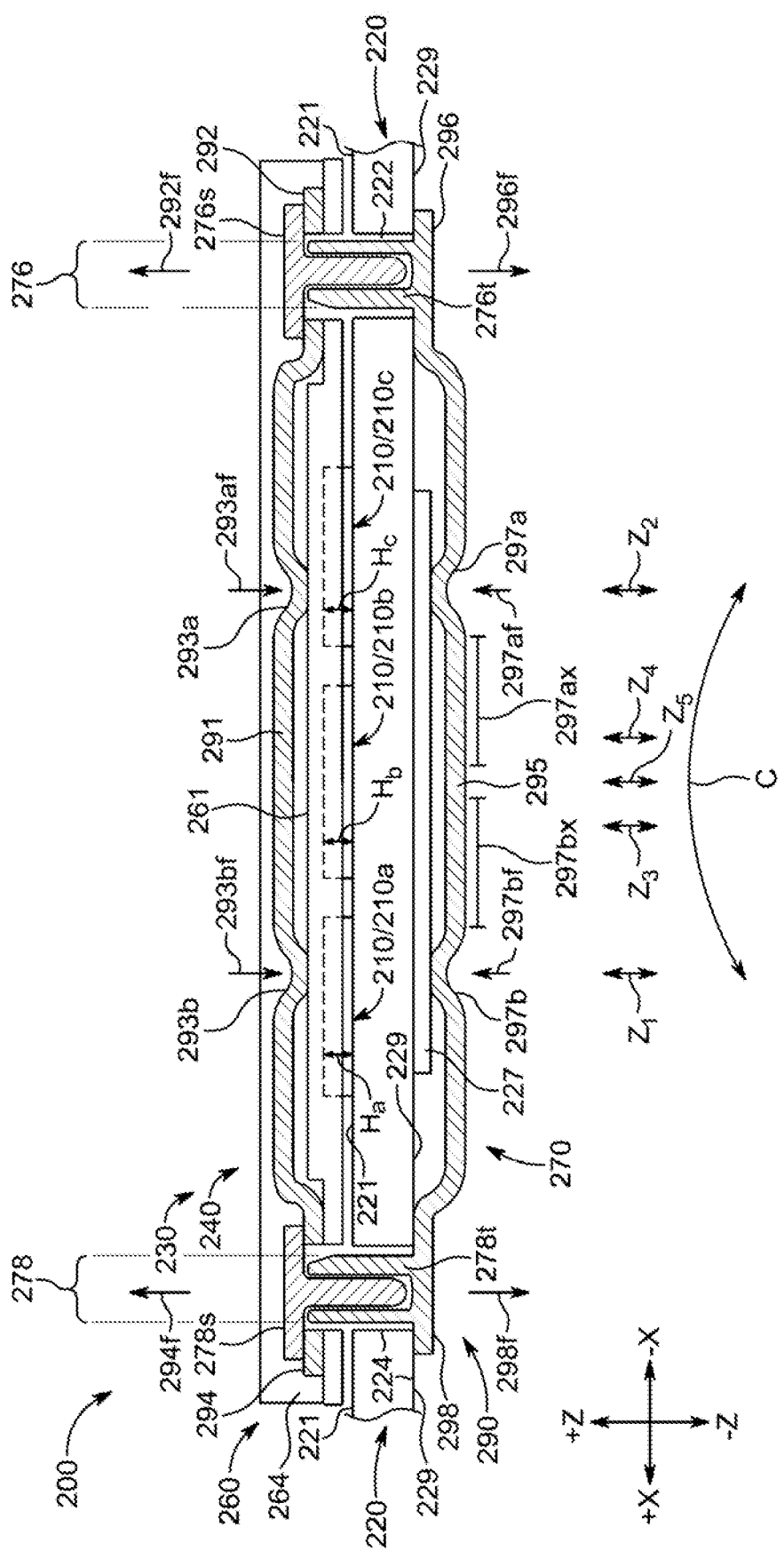
FIG. 2F is a cross-sectional view of the portion of the electronic device of FIGS. 2A-2E, taken from line IIF-IIF of FIG. 2C.

FIG. 1 is a schematic view of an illustrative electronic device 100 that may include a heat-removal assembly. Electronic device 100 can include, but is not limited to, a music player (e.g., an iPod™ available by Apple Inc. of Cupertino, Calif.), video player, still image player, game player, other media player, music recorder, movie or video camera or recorder, still camera, other media recorder, radio, medical equipment, domestic appliance, transportation vehicle instrument, musical instrument, calculator, cellular telephone (e.g., an iPhone™ available by Apple Inc.), other wireless communication device, wearable device (e.g., an Apple Watch™ available by Apple Inc.), personal digital assistant, remote control, pager, computer (e.g., a desktop (e.g., an iMac™ available by Apple Inc.), laptop (e.g., a MacBook™ available by Apple Inc.), tablet (e.g., an iPad™ available by Apple Inc.), server, etc.), monitor, television, stereo equipment, set up box, set-top box, boom box, modem, router, printer, or any combination thereof. Electronic device 100 may be any portable, mobile, hand-held, or miniature electronic device that may be configured to remove heat from any suitable heat-generating component wherever a user travels. Some miniature electronic devices may have a form factor that is smaller than that of hand-held electronic devices, such as an iPhone™. Illustrative miniature electronic devices can be integrated into various objects that may include, but are not limited to, watches (e.g., an Apple Watch™ available by Apple Inc.), rings, necklaces, belts, accessories for belts, headsets, accessories for shoes, virtual reality devices, glasses, other wearable electronics, accessories for sporting equipment, accessories for fitness equipment, key chains, or any combination thereof. Alternatively, electronic device 100 may not be portable at all, but may instead be generally stationary.

As shown in FIG. 1, for example, electronic device 100 may include a housing 101 defining a space or cavity 102 that may at least partially house one or more of a processor assembly 103, a memory assembly 104, a communications assembly 105, a power supply assembly 106, an input assembly 107, an output assembly 108, a circuit board 120, and a heat-removal assembly 130. Electronic device 100 may also include a bus 109 that may provide one or more wired or wireless communication links or paths for transferring data and/or power to, from, or between various assemblies of device 100. In some embodiments, one or more assemblies of electronic device 100 may be combined or omitted. Moreover, electronic device 100 may include any other suitable assemblies not combined or included in FIG. 1 and/or several instances of the assemblies shown in FIG. 1. For the sake of simplicity, only one of each of the assemblies is shown in FIG. 1.

Memory assembly 103 may include one or more storage mediums, including, but not limited to, a hard-drive, flash memory, permanent memory such as read-only memory ("ROM"), semi-permanent memory such as random-access memory ("RAM"), any other suitable type of storage component, and any combinations thereof. Memory 104 may include cache memory, which may be one or more different types of memory used for temporarily storing data for electronic device applications. Communications assembly 105 may be provided to allow device 100 to communicate with one or more other electronic devices (e.g., wirelessly or via a wired connection) using any suitable communications protocol, such as Wi-Fi™ (e.g., an 802.11 protocol), Ethernet, Bluetooth™, high frequency systems (e.g., 900 MHz, 2.4 GHz, and 5.6 GHz communication systems), any other communications protocol, and any combinations thereof. Power supply assembly 106 may provide power to one or more of the various electronic assemblies of electronic device 100. One or more input assemblies 107 may be provided to permit a user to interact or interface with device 100 (e.g., to provide one or more dedicated control functions for making selections or issuing commands associated with operating device 100) or to detect environmental data about an environment of device 100, where input assembly 107 can take a variety of forms, including, but not limited to, a pad, dial, click wheel, scroll wheel, touch screen, one or more buttons (e.g., a keyboard), mouse, joy stick, track ball, microphone, light sensor, camera, video recorder, and any combinations thereof. One or more output assemblies 108 can be provided to present information (e.g., textual, graphical, audible, and/or tactile information) to a user of device 100, where output assembly 108 can take a variety of forms, including, but not limited to, audio speakers, headphones, signal line-outs, visual displays, antennas, infrared ports, rumblers, vibrators, and any combinations thereof. Processor assembly 103 may control the operation of many functions and other circuitry provided by device 100. For example, processor assembly 103 may receive input signals from input assembly 107 and/or drive output signals through output assembly 108. Processor assembly 103 may load a user interface program (e.g., a program stored in memory assembly 104 or on another device or server) to determine how instructions received via input assembly 107 may manipulate the way in which information may be provided to a user via output assembly 108.

Circuit board 120 may be a central or primary printed circuit board ("PCB") of electronic device 100, and may also be known as a main circuit board, mainboard, motherboard, baseboard, system board, planar board, or logic board. Circuit board 120 may provide attachment points for any component(s) of one or more of the other electronic assemblies of electronic device 100 (e.g., processor assembly 103, memory assembly 104, communications assembly 105, power supply assembly 106, input assembly 107, output assembly 108, any external peripheral devices, etc.). Generally, most of the basic circuitry and components required for electronic device 100 to function may be onboard or coupled (e.g., via a cable) to circuit board 120. Circuit board 120 may include one or more chipsets (e.g., a chip with one or more die) or specialized groups of integrated circuits. For example, circuit board 120 may include two components or chips, such as a Northbridge and Southbridge. Although in other embodiments, these chips may be combined into a single component.

Housing 101 may at least partially enclose one or more of the various electronic assemblies associated with operating electronic device 100 for protecting them from debris and other degrading forces external to device 100. In some embodiments, housing 101 may include one or more housing walls that define cavity 102 within which the various electronic assemblies of device 100 can be disposed. Housing 101 can support various electronic assemblies of device 100, such as a portion of input assembly 107 and/or a portion of output assembly 108, at the surfaces or within one or more housing openings through the surfaces of the housing walls. Such housing openings may also be configured to also allow certain fluids (e.g., air) to be drawn into and discharged from cavity 102 of electronic device 100 for helping to manage the internal temperature of device 100. One or more of the electronic assemblies of electronic device 100 may be provided within its own housing component (e.g., input assembly 107 may be an independent keyboard or mouse within its own housing component that may wirelessly or through a wire communicate with processor assembly 103, which may similarly be provided within its own housing component). Housing 101 can be formed from a wide variety of materials including, but not limited to, metals (e.g., steel, copper, titanium, aluminum, and various metal alloys), ceramics, plastics, and any combinations thereof. Housing 101 may also help to define the shape or form of electronic device 100. That is, the contour of housing 101 may embody the outward physical appearance of electronic device 100.

One or more heat-removal assemblies 130 can be provided to help dissipate or diffuse heat generated by the various other electronic assemblies of device 100. Heat-removal assembly 130 may include one or more heat-dissipating subassemblies that may take various forms, including, but not limited to, heat sinks, heat spreaders, heat pipes, and any combinations thereof. For example, a heat-dissipating subassembly may include any suitable thermally conductive substance, such as, for example, graphite, aluminum, magnesium, copper, an aluminum alloy, a magnesium alloy, a copper alloy, and any combinations thereof.

Heat may be generated by one or more heat-generating assemblies 110 of electronic assemblies of device 100, such as a chipset of circuit board 120, processor assembly 103, memory assembly 104, communications assembly 105, power supply assembly 106, input assembly 107, output assembly 108, and/or the like. The heat may increase the temperature of an external surface of any heat-generating assembly 110. If this heat is not adequately dissipated, heat-generating assembly 110 may fail and/or cause damage to electronic device 100. Therefore, one or more heat-dissipating subassemblies of heat-removal assembly 130 may be positioned adjacent an external surface of heat-generating assembly 110 in order to transfer the heat generated at the surface of heat-generating assembly 110 away from heat-generating assembly 110. In order to efficiently remove heat from heat-generating assembly 110, a heat-dissipating subassembly of heat-removal assembly 130 ought to be held against and exert sufficient pressure onto an external surface of heat-generating assembly 110. Such pressure ought to be exerted in an even pressure distribution across such an external surface of such a heat-generating assembly 110 and without bending or improperly crowning portions of device 100 (e.g., without crowning or bending or deflecting or otherwise deforming circuit board 120 or any portion of heat-generating assembly 110 or any portion of the heat-dissipating subassembly of heat-removal assembly 130). Therefore, in some embodiments, heat-removal assembly 130 may include two spring components positioned on opposite sides of circuit board 120 and coupled together by one or more coupling mechanisms via one or more openings provided through circuit board 120 in order to hold a heat-dissipating subassembly (e.g., a heat pipe) of heat-removal assembly 130 against a surface of a heat-generating assembly 110 that may be coupled to one side of circuit board 120. For example, a first of the spring components of heat-removal assembly 130 may be positioned above a top surface of circuit board 120 and may exert a downward force onto a heat-dissipating subassembly of heat-removal assembly 130 for forcing the heat-dissipating subassembly against a surface of heat-generating assembly 110 coupled to the top surface of circuit board 120, while a second of the spring components of heat-removal assembly 130 may be positioned below a bottom surface of circuit board 120 and may exert an upward force onto the bottom surface of circuit board 120 for forcing the heat-generating assembly 110 coupled to the top surface of circuit board 120 against the heat-dissipating subassembly. Such a downward force of the first spring component of heat-removal assembly 130 and such an upward force of the second spring component of heat-removal assembly 130 may directly counter each other, thereby resulting in little to no deformation of circuit board 120 and/or of the heat-generating assembly 110 and/or of the heat-dissipating subassembly of heat-removal assembly 130.

For example, as shown in FIGS. 2A-2F, an electronic device 200, similarly to device 100, may include (e.g., within a housing space defined by a housing) a circuit board 220, at least one heat-generating assembly 210 positioned on circuit board 220, and a heat-removal assembly 230. Circuit board 220 may be any suitable structure that may include a top board surface 221 and a bottom board surface 229. Each heat-generating assembly 210 may be any portion of any electronic assembly of electronic device 200 capable of generating heat (e.g., at least a portion of a processor assembly, at least a portion of a memory assembly, at least a portion of a communications assembly, at least a portion of a power supply assembly, at least a portion of an input assembly, at least a portion of an output assembly, at least a portion of any suitable chipset of circuit board 220, and/or the like). As shown, three heat-generating assemblies 210 may be provided on top board surface 221 of circuit board 229, although any suitable number of heat-generating assemblies fewer than or greater than three may be provided. Each heat-generating assembly 210 may include a heat-generating assembly top surface 211 and a heat-generating assembly bottom surface 219. Bottom surface 219 of each heat-generating assembly 210 may be configured to interact with top board surface 221, such that circuit board 220 may mechanically support each heat-generating assembly 210 and/or such that circuit board 220 may be electrically coupled to each heat-generating assembly 210 (e.g., via any suitable electronic components of circuit board 220, of heat-generating assembly 210, and/or any interconnect components). Each heat-generating assembly 210 may be configured to spread or otherwise generate heat at its top surface 211, thereby increasing the temperature of heat-generating assembly top surface 211.

Heat-removal assembly 230 may be provided to help dissipate or diffuse heat generated by one or more heat-generating assemblies 210. Heat-removal assembly 230 may include a heat-dissipating subassembly 240 that may take various forms, including, but not limited to, heat sinks, heat spreaders, heat pipes, thermal stages, thermal interface features, and any combinations thereof. For example, as shown, heat-dissipating subassembly 240 may include a heat pipe subassembly 250 and a heat spreader subassembly 260. Heat pipe subassembly 250 may provide any suitable heat pipe structure 252 (e.g., a hollow heat pipe structure) or any other suitable heat-transfer device structure that may remove heat away from heat-generating assembly 210, for example, by providing a hot interface at or proximate heat-generating assembly 210 for receiving heat from heat-generating assembly 210 and a cold interface that may access such obtained heat. Heat spreader subassembly 260 may provide any suitable heat spreader structure 262 or any other suitable heat-exchanger device structure that may be positioned between heat pipe structure 252 and heat-generating assembly 210 for thermally conducting or otherwise effectively moving heat from heat-generating assembly 210 (e.g., from top surface 211 of heat-generating assembly 210) to heat pipe structure 252. For example, as shown, a top surface 261 of heat spreader structure 262 may be configured to receive or otherwise support heat pipe structure 252 (e.g., a hot interface of heat pipe structure 252), which may be soldered or otherwise fixed to heat spreader structure 262. As shown, a top channel 263 may be provided in top surface 261 of heat spreader structure 262 for receiving heat pipe structure 252 such that heat pipe structure 252 may not add to (e.g., not contribute to) the height (e.g., Z-height) of heat-dissipating subassembly 240 (e.g., the height of heat spreader structure 262 between surfaces 261 and 269, and not any portion of heat pipe structure 252, may define the magnitude of the height of heat-dissipating subassembly 240). As also shown, a bottom surface 269 of heat spreader structure 262 may be configured to receive or otherwise support or provide a heat exchanger component 268 for positioning along top surface 211 of heat-generating assembly 210. For example, heat exchanger component 268 may be a thermally conductive plate (e.g., a copper plate or any other suitable material plate with high thermal conductivity) that may be operative to spread out any heat received from top surface 211 of heat-generating assembly 210 along heat exchanger component 268, such that the spread-out heat may be more effectively received by heat pipe structure 252 from heat exchanger component 268 (e.g., via a portion of heat spreader structure 262). Additionally or alternatively, as shown, a bottom channel or cavity 267 may be provided in bottom surface 269 of heat spreader structure 262 for receiving and holding heat exchanger component 268 such that heat exchanger component 268 may not add to (e.g., not contribute to) the height (e.g., Z-height) of heat-dissipating subassembly 240 (e.g., the height of heat spreader structure 262 between surfaces 261 and 269, and not any portion of heat exchanger component 268, may define the magnitude of the height of heat-dissipating subassembly 240).

Heat-removal assembly 230 may also include a fastener subassembly 270 that may be operative to exert effective pressure on heat-dissipating subassembly 240 for functionally holding heat-dissipating subassembly 240 against heat-generating assembly 210 (e.g., for functionally holding heat exchanger component 268 against top surface 211 of heat-generating assembly 210) such that heat-dissipating subassembly 240 may effectively and efficiently remove heat from heat-generating assembly 210. Such pressure ought to be exerted in an even pressure distribution across top surface 211 and/or across heat exchanger component 268 and/or without bending or improperly crowning portions of device 200 (e.g., without crowning or bending or deflecting or otherwise deforming circuit board 220 or any portion of heat-generating assembly 210 or any portion of heat-dissipating subassembly 240 of heat-removal assembly 230). Therefore, in some embodiments, as shown, fastener subassembly 270 may include at least one spring subassembly 280 (e.g., first spring subassembly 280) that may be configured to apply forces onto device 200 from different sides of circuit board 220.

Spring subassembly 280 may include a top spring 281 (e.g., first top spring 281) positioned above top board surface 221 of circuit board 220 and a bottom spring 285 (e.g., first bottom spring 285) positioned below bottom board surface 229 of circuit board 220. Top spring 281 may include at least one anchor portion for being anchored to another component (e.g., to bottom spring 285) and at least one heat contact portion (e.g., fulcrum, stress concentrator, feature, etc.) for exerting a contact force on heat-dissipating subassembly 240 (e.g., on a portion of top surface 261 of heat spreader structure 262), while bottom spring 285 may include at least one anchor portion for being anchored to another component (e.g., to top spring 281) and at least one heat contact portion for exerting a contact force on circuit board 220 (e.g., on a portion of bottom surface 229 of circuit board 220). For example, as shown, top spring 281 may include a first anchor portion 282 and a second anchor portion 284 (e.g., at or proximate opposite ends of the structure of top spring 281) as well as at least one heat contact portion therebetween, such as heat contact portions 283a and 283b, while bottom spring 285 may include a first anchor portion 286 and a second anchor portion 288 (e.g., at or proximate opposite ends of the structure of bottom spring 285) as well as at least one heat contact portion therebetween, such as heat contact portions 287a and 287b.

At least one anchor portion of top spring 281 may be fixed or fastened or otherwise coupled to at least one anchor portion of bottom spring 285 for enabling spring subassembly 280 to apply forces onto device 200 from different sides of circuit board 220. For example, as shown, anchor portion 282 of top spring 281 may be fixed or fastened or otherwise coupled to anchor portion 286 of bottom spring 285 using any suitable coupling mechanism 272 that may extend through a passageway 226 provided between surfaces 221 and 229 of circuit board 220, while anchor portion 284 of top spring 281 may be fixed or fastened or otherwise coupled to anchor portion 288 of bottom spring 285 using any suitable coupling mechanism 274 that may extend through a passageway 228 provided between surfaces 221 and 229 of circuit board 220. While passageways 226 and 228 may be distinct from one another (as shown), in other embodiments they may be different portions of a single passageway (not shown). Springs 281 and 285 may be configured such that, when their opposing anchor portions are coupled to each other through circuit board passageways 226 and 228, heat contact portions 283a and 283b (e.g., fulcrums, stress concentrators, features, etc.) may be operative to apply respective forces 283af and 283bf (e.g., in the −Z direction) onto different portions of top surface 261 of heat spreader structure 262, and/or heat contact portions 287a and 287b (e.g., fulcrums, stress concentrators, features, etc.) may be operative to apply respective forces 287af and 287bf (e.g., in the +Z direction) onto different portions of bottom surface 229 of circuit board 220 (e.g., directly or via a protective padding 225 that may be provided along a portion of bottom surface 229), and/or anchor portions 282 and 284 of top spring 281 may be operative to apply respective forces 282f and 284f (e.g., in the +Z direction) onto respective anchor portions 286 and 288 of bottom spring 285, and/or anchor portions 286 and 288 of bottom spring 285 may be operative to apply respective forces 286f and 288f (e.g., in the −Z direction) onto respective anchor portions 282 and 284 of top spring 281. Each one of top spring 281 and bottom spring 285 may be provided by any suitable type of spring structure (e.g., any suitable leaf spring, cantilever spring, beam spring, etc.) that may be configured to exist in a pre-bent shape or resting position state of FIGS. 2A and 2B when no force is applied thereto and to exist in a bent shape or a compressed or stretched state of FIGS. 2C-2F when their anchor portions are coupled to each other (e.g., when anchor portions 282 and 286 are fixed together via coupling mechanism 272 and passageway 226 and when anchor portions 284 and 288 are fixed together via coupling mechanism 274 and passageway 228), which may facilitate or bias or otherwise cause springs 281 and 285 to exert forces 282f, 283af, 283bf, 284f, 286f, 287af, 287bf, and 288f. As shown, a top channel or cavity 266 may be provided in top surface 261 of heat spreader structure 262 for receiving top spring 281 such that top spring 281 (e.g., in combination with coupling mechanisms 272 and 274 when fixed to bottom spring 285) may not add to (e.g., not contribute to) the height (e.g., Z-height) of heat-dissipating subassembly 240 (e.g., the height of heat spreader structure 262 between surfaces 261 and 269, and not any portion of top spring 281, may define the magnitude of the height of heat-dissipating subassembly 240).

Fastener subassembly 270 may also include at least one other spring subassembly 290 (e.g., second spring subassembly 290) that may also be configured to apply forces onto device 200 from different sides of circuit board 220 and also from an opposite side of heat-generating assembly 210 than spring subassembly 280 (e.g., opposite sides of heat-generating assembly 210 with respect to the Y-axis). Spring subassembly 290 may include a top spring 291 (e.g., second top spring 291) positioned above top board surface 221 of circuit board 220 and a bottom spring 295 (e.g., second bottom spring 295) positioned below bottom board surface 229 of circuit board 220. Top spring 291 may include at least one anchor portion for being anchored to another component (e.g., to bottom spring 295) and at least one heat contact portion (e.g., fulcrum, stress concentrator, feature, etc.) for exerting a contact force on heat-dissipating subassembly 240 (e.g., on a portion of top surface 261 of heat spreader structure 262), while bottom spring 295 may include at least one anchor portion for being anchored to another component (e.g., to top spring 291) and at least one heat contact portion for exerting a contact force on circuit board 220 (e.g., on a portion of bottom surface 229 of circuit board 220). For example, as shown, top spring 291 may include a first anchor portion 292 and a second anchor portion 294 (e.g., at or proximate opposite ends of the structure of top spring 291) as well as at least one heat contact portion therebetween, such as heat contact portions 293a and 293b, while bottom spring 295 may include a first anchor portion 296 and a second anchor portion 298 (e.g., at or proximate opposite ends of the structure of bottom spring 295) as well as at least one heat contact portion therebetween, such as heat contact portions 297a and 297b.

At least one anchor portion of top spring 291 may be fixed or fastened or otherwise coupled to at least one anchor portion of bottom spring 295 for enabling spring subassembly 290 to apply forces onto device 200 from different sides of circuit board 220. For example, as shown, anchor portion 292 of top spring 291 may be fixed or fastened or otherwise coupled to anchor portion 296 of bottom spring 295 using any suitable coupling mechanism 276 that may extend through a passageway 222 provided between surfaces 221 and 229 of circuit board 220, while anchor portion 294 of top spring 291 may be fixed or fastened or otherwise coupled to anchor portion 298 of bottom spring 295 using any suitable coupling mechanism 278 that may extend through a passageway 224 provided between surfaces 221 and 229 of circuit board 220. While passageways 222 and 224 may be distinct from one another (as shown), in other embodiments they may be different portions of a single passageway (not shown). Springs 291 and 295 may be configured such that, when their opposing anchor portions are coupled to each other through circuit board passageways 222 and 224, heat contact portions 293a and 293b (e.g., fulcrums, stress concentrators, features, etc.) may be operative to apply respective heat contact forces 293af and 293bf (e.g., in the −Z direction) onto different portions of top surface 261 of heat spreader structure 262, and/or heat contact portions 297a and 297b (e.g., fulcrums, stress concentrators, features, etc.) may be operative to apply respective heat contact forces 297af and 297bf (e.g., in the +Z direction) onto different portions of bottom surface 229 of circuit board 220 (e.g., directly or via a protective padding 227 that may be provided along a portion of bottom surface 229), and/or anchor portions 292 and 294 of top spring 291 may be operative to apply respective anchor forces 292f and 294f (e.g., in the +Z direction) onto respective anchor portions 296 and 298 of bottom spring 295, and/or anchor portions 296 and 298 of bottom spring 295 may be operative to apply respective anchor forces 296f and 298f (e.g., in the −Z direction) onto respective anchor portions 292 and 294 of top spring 291. Each one of top spring 291 and bottom spring 295 may be provided by any suitable type of spring structure (e.g., any suitable leaf spring, cantilever spring, beam spring, etc.) that may be configured to exist in a pre-bent shape or resting position state of FIGS. 2A and 2B when no force is applied thereto and to exist in a bent shape or a compressed or stretched state of FIGS. 2C-2F when their anchor portions are fixed or fastened or otherwise coupled to each other (e.g., when anchor portions 292 and 296 are fixed together via coupling mechanism 276 and passageway 222 and when anchor portions 294 and 298 are fixed together via coupling mechanism 278 and passageway 224), which may facilitate springs 291 and 295 to exert forces 292f, 293af, 293bf, 294f, 296f, 297af, 297bf, and 298f. As shown, a top channel or cavity 264 may be provided in top surface 261 of heat spreader structure 262 for receiving top spring 291 such that top spring 291 (e.g., in combination with coupling mechanisms 276 and 278 when fixed to bottom spring 295) may not add to (e.g., not contribute to) the height (e.g., Z-height) of heat-dissipating subassembly 240 (e.g., the height of heat spreader structure 262 between surfaces 261 and 269, and not any portion of top spring 291, may define the magnitude of the height of heat-dissipating subassembly 240).

Each one of coupling mechanisms 272, 274, 276, and 278 may be configured in any suitable manner to fix or fasten or otherwise couple an anchor portion of a top spring to an anchor portion of a bottom spring via a circuit board passageway (e.g., to oppose anchor forces of the anchor portions that the coupling mechanism is coupling together and/or to prevent movement of the top spring anchor portion with respect to the bottom spring anchor portion). For example, as shown, coupling mechanism 272 may include a screw 272s that may be operative to be passed partially through an opening 272o provided through top spring 281 (e.g., at or near anchor portion 282) and through an opening 272p provided through heat spreader structure 262 (e.g., within cavity 266) and through circuit board passageway 226 and into a threaded boss 272t that may be provided on or by bottom spring 285 (e.g., at or near anchor portion 286), such that screwing screw 272s into threaded boss 272t may fix anchor portion 282 of top spring 281 to anchor portion 286 of bottom spring 285 via circuit board passageway 226, where threaded boss 272t may be configured to extend up through at least a portion of circuit board passageway 226 and/or opening 272p and/or opening 272o (e.g., to reduce the overall height of coupling mechanism 272 and/or of fastener subassembly 270 and/or of heat-removal assembly 230 (e.g., Z-height)). Similarly, as shown, coupling mechanism 274 may include a screw 274s that may be operative to be passed partially through an opening 274o provided through top spring 281 (e.g., at or near anchor portion 284) and through an opening 274p provided through heat spreader structure 262 (e.g., within cavity 266) and through circuit board passageway 228 and into a threaded boss 274t that may be provided on or by bottom spring 285 (e.g., at or near anchor portion 288), such that screwing screw 274s into threaded boss 274t may fix anchor portion 284 of top spring 281 to anchor portion 288 of bottom spring 285 via circuit board passageway 228, where threaded boss 274t may be configured to extend up through at least a portion of circuit board passageway 228 and/or opening 274p and/or opening 274o (e.g., to reduce the overall height of coupling mechanism 274 and/or of fastener subassembly 270 and/or of heat-removal assembly 230 (e.g., Z-height)). Similarly, as shown, coupling mechanism 276 may include a screw 276s that may be operative to be passed partially through an opening 276o provided through top spring 291 (e.g., at or near anchor portion 292) and through an opening 276p provided through heat spreader structure 262 (e.g., within cavity 264) and through circuit board passageway 222 and into a threaded boss 276t that may be provided on or by bottom spring 295 (e.g., at or near anchor portion 296), such that screwing screw 276s into threaded boss 276t may fix anchor portion 292 of top spring 291 to anchor portion 296 of bottom spring 295 via circuit board passageway 222, where threaded boss 276t may be configured to extend up through at least a portion of circuit board passageway 222 and/or opening 276p and/or opening 276o (e.g., to reduce the overall height of coupling mechanism 276 and/or of fastener subassembly 270 and/or of heat-removal assembly 230 (e.g., Z-height)). Similarly, as shown, coupling mechanism 278 may include a screw 278s that may be operative to be passed partially through an opening 278o provided through top spring 291 (e.g., at or near anchor portion 294) and through an opening 278p provided through heat spreader structure 262 (e.g., within cavity 264) and through circuit board passageway 224 and into a threaded boss 278t that may be provided on or by bottom spring 295 (e.g., at or near anchor portion 298), such that screwing screw 278s into threaded boss 278t may fix anchor portion 294 of top spring 291 to anchor portion 298 of bottom spring 295 via circuit board passageway 224, where threaded boss 278t may be configured to extend up through at least a portion of circuit board passageway 224 and/or opening 278p and/or opening 278o (e.g., to reduce the overall height of coupling mechanism 278 and/or of fastener subassembly 270 and/or of heat-removal assembly 230 (e.g., Z-height)).

While opposing anchor portions of opposing springs may be shown to be fixed to one another via a coupling mechanism provided by a screw and a threaded boss on a bottom spring, it is understood that any suitable coupling mechanism may be provided for coupling any two opposing anchor portions of any two opposing springs. For example, rather than providing a threaded boss as an integral part of a spring, a threaded boss may be made available through an opening in a spring (e.g., boss 276t may be provided through an opening in anchor portion 296 of spring 295 (e.g., similarly to screw 276s being provided through opening 276o in anchor portion 292 of spring 291) rather than as a top of anchor portion 296). As another example, rather than providing a threaded boss at an anchor portion of a spring, a threaded nut may be made available beyond an opening in a spring (e.g., a nut may be provided below (e.g., in the −Z direction beyond) an opening in anchor portion 296 of spring 295 that may receive and fasten screw 276s thereto). Additionally or alternatively, rather than providing a threaded boss or nut at or below an anchor portion of a bottom spring, a threaded boss or nut may be provided at or above an anchor portion of a top spring and a screw may be provided at or below an anchor portion of a bottom spring. Any other suitable type of coupling mechanism may be used to couple or fix or fasten or anchor opposing anchor portions of opposing springs to one another via a circuit board passageway, and different coupling mechanisms of fastener subassembly 270 may differ from one another in any suitable way(s) (e.g., coupling mechanism 272 may differ from coupling mechanism 274 and/or 276 and/or 278 in one or more different ways). For example, one, some, or each coupling mechanism may be provided by any suitable rivet mechanism that may couple two anchoring portions. A coupling mechanism may fix or fasten or anchor or connect or otherwise couple two opposing anchor portions to one another via a circuit board passageway without fixing or fastening or anchoring or connecting or otherwise coupling the anchor portions to the circuit board. Additionally or alternatively, a coupling mechanism may fix or fasten or anchor or connect or otherwise couple two opposing anchor portions to one another via an opening through a structure of a heat-dissipating assembly (e.g., via opening 278p provided through heat spreader structure 262) without fixing or fastening or anchoring or connecting or otherwise coupling the anchor portions to the heat-dissipating assembly. Opposing springs may be configured to have the same spring rate such that they may find a neutral position to balance themselves once opposing anchor portions are coupled to one another.

By fastening an anchor portion of a top spring to an anchor portion of an opposing bottom spring via a circuit board passageway, the coupled anchor portions of the opposed springs may be configured to apply anchor forces to one another that may directly counter each other (e.g., components of forces 294f and 298f of coupled anchor portions 294 and 298 may oppose one another in the same Z-axis and/or may be of the same magnitude), which may thereby result in little to no deformation of a heat-dissipating subassembly and/or of a circuit board that may be positioned between the opposing springs. For example, when anchor portions 294 and 298 are coupled together, anchor portion 294 may apply upward force 294f on anchor portion 298 of bottom spring 295 that may directly counter downward force 298f that may be applied by anchor portion 298 on anchor portion 294 of top spring 291, such that any moment exerted upon or applied to heat-dissipating subassembly 240 by coupled anchor portions 294 and 298 (e.g., to a portion of heat spreader subassembly 260 that may be positioned between coupled anchor portions 294 and 298) may be reduced or minimized or obviated, and/or such that deformation of heat-dissipating subassembly 240 by coupled anchor portions 294 and 298 may be reduced or minimized or obviated. For example, the bending moment (e.g., about a Y-axis) may be essentially eliminated. This may also be true with respect to any portion of heat-dissipating subassembly 240 between coupled anchor portions 282 and 286 with forces 282$f$ and 286$f$ and/or between coupled anchor portions 284 and 288 with forces 284$f$ and 288$f$ and/or between coupled anchor portions 292 and 296 with forces 292$f$ and 296. Additionally or alternatively, for example, when anchor portions 294 and 298 are coupled together, anchor portion 294 may apply upward force 294$f$ on anchor portion 296 of bottom spring 295 that may directly counter downward force 298$f$ that may be applied by anchor portion 298 on anchor portion 294 of top spring 291, such that any moment exerted upon or applied to circuit board 220 by coupled anchor portions 294 and 298 (e.g., to a portion of circuit board 220 about circuit board passageway 224 that may be positioned between coupled anchor portions 294 and 298) may be reduced or minimized or obviated, and/or such that deformation of circuit board 220 by coupled anchor portions may be reduced or minimized or obviated. For example, the bending moment (e.g., about a Y-axis) may be essentially eliminated. This may also be true with respect to any portion of circuit board 220 between coupled anchor portions 282 and 286 with forces 282$f$ and 286$f$ and/or between coupled anchor portions 284 and 288 with forces 284$f$ and 288$f$ and/or between coupled anchor portions 292 and 296 with forces 292$f$ and 296.

Moreover, by fastening at least one anchor portion of a top spring to at least one anchor portion of an opposing bottom spring via a circuit board passageway, one or more heat contact portions of each one of the coupled springs may be configured to apply heat contact forces to device 200 that may directly counter each other (e.g., components of forces 293$bf$ and 297$bf$ of opposing heat contact portions 293$b$ and 297$b$ of opposing coupled springs 291 and 295 may oppose one another in the same Z-axis and/or may be of the same magnitude), which may thereby result in little to no deformation of a heat-dissipating subassembly and/or of a circuit board that may be positioned between the opposing springs. For example, when springs 291 and 295 are coupled together (e.g., when anchor portions 292 and 296 are coupled together and when anchor portions 294 and 298 are coupled together), such that springs 291 and 295 may be in their bent shapes or compressed or stretched states of FIGS. 2C-2F, heat contact portion 293$a$ may apply downward force 293$af$ (e.g., downwardly along a first Z-axis $Z_1$ of FIG. 2F) onto a portion of top surface 261 of heat spreader structure 262 that may directly counter upward force 297$af$ that may be applied (e.g., upwardly along first Z-axis $Z_1$ of FIG. 2F) by heat contact portion 297$a$ on bottom surface 229 of circuit board 220 (e.g., directly or via padding 227) and/or heat contact portion 293$b$ may apply downward force 293$bf$ (e.g., downwardly along a second Z-axis $Z_2$ of FIG. 2F) onto another portion of top surface 261 of heat spreader structure 262 that may directly counter upward force 297$bf$ that may be applied (e.g., upwardly along second Z-axis $Z_2$ of FIG. 2F) by heat contact portion 297$b$ on bottom surface 229 of circuit board 220 (e.g., directly or via padding 227), such that any moment exerted upon or applied to device 200 by heat contact portions 293$a$ and 297$a$ and/or by heat contact portions 293$b$ and 297$b$ (e.g., to a portion of heat-dissipating subassembly 240 and/or to a portion of circuit board 220 and/or to any other portion of device 200 that may be positioned between opposing heat contact portions) may be reduced or minimized or obviated, and/or such that deformation of device 200 (e.g., of heat-dissipating subassembly 240 and/or of circuit board 220) by opposing heat contact portions may be reduced or minimized or obviated (e.g., components of forces 293$bf$ and 297$bf$ may oppose one another in the same Z-axis and/or may be of the same magnitude). For example, the bending moment (e.g., about a Y-axis) may be essentially eliminated. This may also be true with respect to any portion of device 200 between opposing heat contact portions 283$a$ and 287$a$ with forces 283$af$ and 287$af$ and/or between opposing heat contact portions 283$b$ and 287$b$ with forces 283$bf$ and 287$bf$.

Therefore, while one or more heat contact forces applied by one or more heat contact portions of each one of two opposing springs may counter each other on opposite sides of circuit board 220 for reducing or obviating deformation of circuit board 220 and/or of heat-dissipating subassembly 240, such heat contact forces may also be operative to hold heat-dissipating subassembly 240 in a functionally effective position against heat-generating assembly 210 of device 200 (e.g., to hold heat exchanger component 268 along and against top surface 211 of heat-generating assembly 210 (e.g., in a pressure distributed manner across heat exchanger component 268 and top surface 211)). However, in some other embodiments, heat contact portions of opposing springs may be offset from one another to induce certain crowning or other deformation of portions of device 200 when useful. For example, although FIGS. 2A-2F may show forces 293$af$ and 297$af$ of opposing heat contact portions 293$a$ and 297$a$ to be aligned with one another (e.g., along first Z-axis $Z_2$ of FIG. 2F) and/or forces 293$bf$ and 297$bf$ of opposing heat contact portions 293$b$ and 297$b$ to be aligned with one another (e.g., along second Z-axis $Z_1$ of FIG. 2F) for reducing or obviating crowning or any other deformation of circuit board 220 and/or of heat-dissipating subassembly 240 and/or of any other portion of device 200 therebetween, heat contact portion 297$a$ may instead be offset in the +X direction by a distance 297$ax$ from second Z-axis $Z_2$ such that upward heat contact force 297$af$ may be offset from downward heat contact force 293$af$ (e.g., heat contact force 297$af$ may be applied upwardly along a fourth Z-axis $Z_4$ of FIG. 2F that may be offset from second Z-axis $Z_2$ along which downward heat contact force 293$af$ may be applied by heat contact portion 293$a$) and/or heat contact portion 297$b$ may instead be offset in the −X direction by a distance 297$bx$ from first Z-axis $Z_1$ such that upward heat contact force 297$bf$ may be offset from downward heat contact force 293$bf$ (e.g., heat contact force 297$bf$ may be applied upwardly along a third Z-axis $Z_3$ of FIG. 2F that may be offset from first Z-axis $Z_1$ along which downward heat contact force 293$bf$ may be applied by heat contact portion 293$b$). Such offset heat contact forces of opposing springs may encourage a particular type of crowning or deflection or deformation of device 200. For example, such downward heat contact forces 293$af$ and 293$bf$ along respective outer Z-axes $Z_2$ and $Z_1$ in combination with such upward heat contact forces 297$af$ and 297$bf$ along respective inner Z-axes $Z_4$ and $Z_3$ may encourage deformation or crowning of device 200 (e.g., of circuit board 220 and/or of heat-dissipating subassembly 240) in the shape of arrow C of FIG. 2F, which may be useful to encourage consistent contact between heat-dissipating subassembly 240 and heat-generating assembly 210 in certain embodiments (e.g., when height Ha of a first heat-generating assembly 210$a$ is less than height Hb of a second heat-generating assembly 210$b$ and/or when height Hc of a third heat-generating assembly 210$c$ is less than height Hb of second heat-generating assembly 210$b$). In addition to or as an alternative to offsetting certain heat contact portions of opposing springs of a spring subassembly, different opposing springs of a spring assembly may have different numbers of heat contact portions. For example, rather than each one of opposing springs 291 and 295 providing two heat contact portions (e.g., heat contact portions 293a, 293b, 297a, and 297b), spring 291 may include each one of two heat contact portions 293a and 293b for applying downward heat contact forces 293af and 293bf along respective Z-axes $Z_2$ and $Z_1$, while spring 295 may include only one heat contact portion for applying one upward heat contact force (e.g., along a fifth Z-axis $Z_5$, which for example, may also encourage deformation in the shape of arrow C).

Heat spreader subassembly 260 may be configured to interface with at least one anchor portion of at least one spring of fastener assembly 270. For example, as shown in FIGS. 2B-2F, each end portion of cavity 266 in top surface 261 of heat spreader structure 262 may be configured to receive and interface with a respective one of anchor portions 282 and 284 of spring 281, such that the end portions of heat spreader structure 262 about openings 272p and 274p may be held in between coupled anchor portions of springs 281 and 285, and each end portion of cavity 264 in top surface 261 of heat spreader structure 262 may be configured to receive and interface with a respective one of anchor portions 292 and 294 of spring 291, such that the end portions of heat spreader structure 262 about openings 272p and 274p may be held in between coupled anchor portions of springs 291 and 295. However, in alternative embodiments (not shown), one or more of top springs 281 and 291 may extend beyond at least one end of heat spreader structure 262 (e.g., along the X-axis in the +X-direction and/or in the −X-direction), such that at least one anchor portion of a top spring may not interface with any portion of heat spreader subassembly 260 when coupled to an anchor portion of a bottom spring. For example, a length of top spring 291 along the X-axis may be longer than such a length of heat spreader structure 262 such that anchor portion 292 of top spring 291 may be coupled to anchor portion 296 of bottom spring 295 by coupling mechanism 276 that may not extend through any portion of heat spreader structure 262 (e.g., coupling mechanism 276 may be configured not to extend through any opening 276p through heat spreader structure 262) or through any other portion of heat-dissipating subassembly 240 and/or such that anchor portion 294 of top spring 291 may be coupled to anchor portion 298 of bottom spring 295 by coupling mechanism 278 that may not extend through any portion of heat spreader structure 262 (e.g., coupling mechanism 278 may be configured not to extend through any opening 278p through heat spreader structure 262) or through any other portion of heat-dissipating subassembly 240. In such embodiments, heat contact portions of spring 291 (e.g., heat contact portions 293a and 293b) may still interface with heat spreader structure 262 for holding heat-dissipating subassembly 240 against heat-generating assembly 210.

Heat spreader subassembly 260 of heat-dissipating subassembly 240 may be configured to interface with at least one heat contact portion of at least one top spring of fastener subassembly 270 such that fastener subassembly 270 may be operative to force heat exchanger component 268 of heat spreader subassembly 260 against heat-generating assembly 210 for removing heat therefrom (e.g., in coordination with heat pipe subassembly 250 of heat-dissipating subassembly 240), where the interface between heat spreader subassembly 260 and one or more heat contact portions of fastener subassembly 270 may be positioned adjacent but not above heat pipe subassembly 250 (e.g., any heat contact force may be offset (e.g., in the −Y-direction and/or in the +Y-direction) along a Y-axis from heat pipe structure 252). Alternatively, in some other embodiments, fastener subassembly 270 may be configured to position one or more heat contact portions of one or more top springs above and aligned with heat pipe subassembly 250 and/or to position one or more heat contact portions of one or more bottom springs below and aligned with heat pipe subassembly 250, for example, such that one or more of heat contact forces 283af, 283bf, 287af, 287bf, 293af, 293bf, 297af, and 297bf may be aligned (e.g., along a Z-axis) with a portion of heat pipe subassembly 250 (e.g., with a portion of heat pipe structure 252). This may be accomplished by heat-dissipating subassembly 240 being configured such that at least a portion of heat pipe subassembly 250 may extend underneath a portion of heat spreader subassembly 260 (e.g., underneath a portion of heat spreader structure 262) that may be interfacing with a heat contact portion of a top spring of fastener subassembly 270 and/or by heat-dissipating subassembly 240 being configured not to provide any heat spreader subassembly 260, but, instead, to provide heat pipe subassembly 250 with the ability to interface with one or more heat contact portions of one or more top springs of fastener subassembly 270.

While each spring assembly of fastener subassembly 270 may be shown (e.g., in FIGS. 2A-2F) to include two substantially linear springs (e.g., along an X-axis), each of which may include two anchor portions at opposite ends of the spring and one or more force contact portions between the two anchor portions, each spring may be any suitable shape with any suitable number of anchor portions and any suitable number of force contact portions, and opposing springs of a particular spring assembly may or may not be of the same shape and/or may or may not include the same number of anchor portions and/or the same number of force contact portions. For example, as shown in FIG. 3A, an electronic device 300 may include a circuit board 320 with a top circuit board surface 321 above which a heat-removal subassembly 330 may be provided for removing heat from a heat-generating assembly 310 that may be positioned above top circuit board surface 321, where heat-removal subassembly 330 may include a fastener subassembly 370 with a spring assembly 380 with an H-shaped top spring 381 that may include spring portions 381a-381g, such as portions 381a-381c sequentially aligned along a first linear portion of spring 381, spring portions 381d-381f sequentially aligned along a second linear portion of spring 381, and spring portion 381g that may be aligned in between portions 381b and 381e along a third linear portion of spring 381 that may extend between and perpendicularly to the first and second linear portions. Any one or more of portions 381a-381g may be provided as an anchor portion of spring 381 for being fastened to an opposing anchor portion of a bottom spring of spring assembly 380, while any one or more other non-anchor portions of portions 381a-381g may be provided as a heat contact portion of spring 381. For example, as shown in FIG. 3B, spring assembly 380 may also include an H-shaped bottom spring 385 that may be positioned below circuit board bottom surface 329 of circuit board 320 and that may include spring portions 385a-385g. As one example, portion 381g of spring 381 and portion 385g of spring 385 may each be an anchor portion that may be fastened to one another by any suitable coupling mechanism (e.g., that may be provided via a passageway through circuit board 320 and via one or more passageways through one or more subassemblies of heat-dissipating subassembly 340 (e.g., through a heat pipe and/or through a heat spreader, etc.)), while any one, some, or each of portions 381a-381f and any one, some, or each of portions 385a-385f may be a heat contact portion. As just one other example, of countless possible examples, each one of portions 381a, 381c, 381d, 381*f*, 385*a*, 385*c*, 385*d*, and 385*f* may be anchor portions of fastener subassembly 370 and each one of portions 381*b*, 381*e*, 381*g*, 385*b*, 385*e*, and 385*g* may be heat contact portions of fastener subassembly 370. As just yet one other example, of countless possible examples, each one of portions 381*b*, 381*e*, 385*b*, and 385*e* may be anchor portions of fastener subassembly 370 and each one of portions 381*a*, 381*c*, 381*d*, 381*f*, 381*g*, 385*a*, 385*c*, 385*d*, 385*f*, and 385*g* may be heat contact portions of fastener subassembly 370. In yet other embodiments, bottom spring 385 of fastener subassembly 370 may be used with two top springs 281 and 291 of fastener subassembly 270, where portions 385*a*, 385*c*, 385*d*, and 385*f* of spring 385 may be anchor portions operative to be fastened to anchor portions 282, 284, 292, and 294 of springs 281 and 291, while portions 385*b*, 385*e*, and 385*g* may be heat contact portions, which may enable one less spring to be used (e.g., to obviate the use of two bottom springs 291 and 295).

Figure 4B:
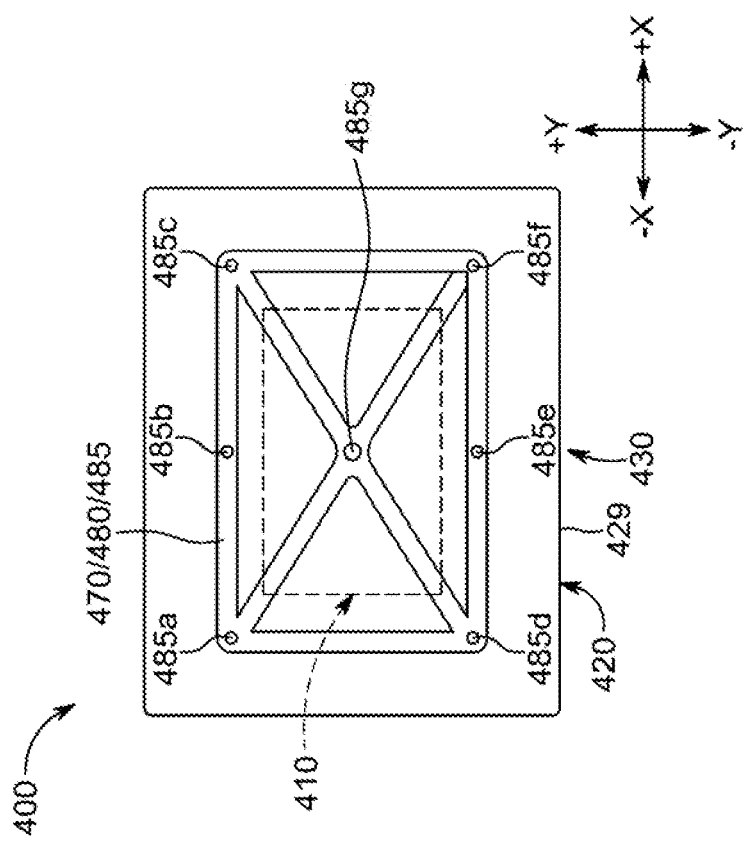
FIG. 4B is an assembled bottom plan view of the portion of the electronic device of FIG. 4A.
Figure 4A:
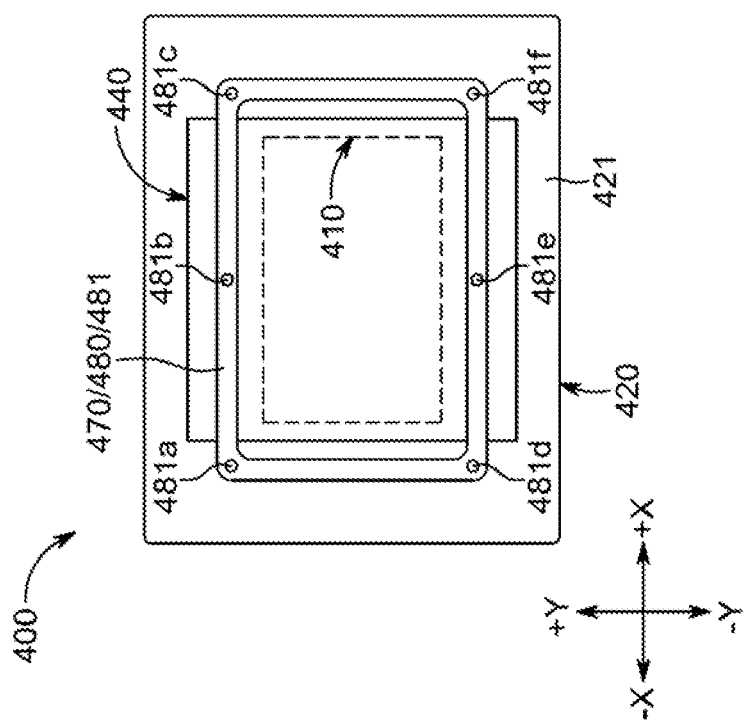
FIG. 4A is an assembled top plan view of a portion of yet another electronic device including a heat-removal assembly.

Top and bottom springs of a fastener assembly may be of different shapes with different numbers of heat contact portions. As shown in FIG. 4A, an electronic device 400 may include a circuit board 420 with a top circuit board surface 421 above which a heat-removal subassembly 430 may be provided for removing heat from a heat-generating assembly 410 that may be positioned above top circuit board surface 421, where heat-removal subassembly 430 may include a fastener subassembly 470 with a spring assembly 480 with a hollow picture frame-shaped top spring 481 that may include spring portions 481*a*-481*f*, such as portions 481*a*-481*c* sequentially aligned along one side of the frame, and portions 481*d*-481*f* sequentially aligned along another side of the frame. Any one or more of portions 481*a*-481*f* may be provided as an anchor portion of spring 481 for being fastened to an opposing anchor portion of a bottom spring of spring assembly 480, while any one or more other non-anchor portions of portions 481*a*-481*f* may be provided as a heat contact portion of spring 481. For example, as shown in FIG. 4B, spring assembly 480 may also include a picture frame-shaped bottom spring 485 with an X-shaped interior that may be positioned below circuit board bottom surface 429 of circuit board 420 and that may include spring portions 485*a*-485*g* (e.g., with region 485*g* in the middle of the X-shaped interior). As one example, portions 481*a*, 481*c*, 481*d*, and 481*f* of spring 481 and portions 485*a*, 485*c*, 485*d*, and 485*f* of spring 485 may each be an anchor portion that may be fastened to one another by any suitable coupling mechanism (e.g., that may be provided via a passageway through circuit board 420 and via one or more passageways through one or more subassemblies of heat-dissipating subassembly 440 (e.g., through a heat pipe and/or through a heat spreader, etc.) or not via any portion of heat-dissipating subassembly 440 (see, e.g., the corner spring portions that are not aligned with any portion of heat-dissipating subassembly 440)), while any one, some, or each of portions 481*b* and 481*e* and any one, some, or each of portions 485*b*, 485*e*, and 485*g* may be a heat contact portion. Such a fastener subassembly 470 may enable two less springs to be used than fastener subassembly 270 (e.g., to obviate the use of a second top spring and a second bottom spring).

Therefore, a heat removal assembly may include a fastener subassembly that provides at least one top spring above a top circuit board surface and at least one bottom spring below a bottom circuit board surface, where each top spring may include at least one anchor portion coupled to an anchor portion of an opposing bottom spring by any suitable coupling mechanism via a passageway extending through the top and bottom surfaces of the circuit board, where each top spring may include one or more top spring heat contact portions operative to contact and/or exert downward pressure on a portion of a heat-dissipating subassembly for forcing the heat-dissipating subassembly against a heat generating assembly positioned between the heat-dissipating subassembly and the top circuit board surface (e.g., to press the heat-dissipating subassembly downward towards the circuit board), and where each bottom spring may include one or more bottom spring heat contact portions operative to contact and/or exert upward pressure on a portion of the bottom circuit board surface (e.g., to press the circuit board upward towards the heat-dissipating subassembly). One, some, or each top spring heat contact portion may be opposed to (e.g., aligned with along an axis perpendicular to the top circuit board surface) a bottom spring heat contact portion such that the opposing spring heat contact portions may apply forces that may directly counter one another for preventing those spring heat contact portions from promoting deformation and/or crowning of the circuit board and/or of the heat-dissipating subassembly.

Rather than coupling an anchor portion of a spring to the circuit board, which may put a direct bending moment into the circuit board, an anchor portion of a spring of a fastener subassembly may be coupled to an anchor portion of another spring of the fastener subassembly that may be on an opposing side of the circuit board. Moreover, by providing opposing springs of a fastener subassembly on opposing sides of a circuit board for holding a heat-dissipating subassembly against a heat-generating assembly on the circuit board, each spring may include a heat contact portion that may be operative to apply a heat contact force towards its side of the circuit board that may be counter to a heat contact force applied by an opposing spring toward its side of the circuit board, such that the opposing heat contact forces may balance each other out for reducing or obviating deformation and/or crowning of the circuit board and/or for reducing or obviating deformation and/or crowning of at least a portion of the heat-dissipating subassembly and/or for reducing or obviating deformation and/or crowning of at least a portion of the heat-generating assembly. Such a fastener subassembly may be operative to exert pressure evenly across a heat-dissipating subassembly (e.g., a thermal stage and/or heat spreader and/or heat pipe) so that the heat-dissipating subassembly may be held evenly against at least a portion of heat-generating assembly. Such a fastener subassembly may limit deformation and/or crowning while also enabling application of even pressure, which may provide a more effective and efficient heat removal assembly and/or may enable use of a thinner circuit board and/or a thinner heat-dissipating subassembly (e.g., along a Z-axis height). Variability of pressure applied to the device by such a fastener subassembly may be reduced due to at least some spring manufacturing tolerances being balanced out due to opposing springs. Different springs of such a fastener subassembly may be provided by different materials and/or may be provided to display different characteristics, where, for example, a top spring may be made of a first material and an opposing bottom spring may be made of a second material (e.g., a thicker top spring made of a weaker material and a thinner bottom spring made of a stronger material (e.g., such that the opposing springs may exert similar forces but such that the bottom spring may be thinner for enabling a thinner Z-height than the top spring)).

Any spring may be any suitable type of spring that may be provided by a single structure or by multiple spring structures that may be stacked on top of one another (e.g., top spring 281 may be a single spring, while bottom spring 285 may be provided by three or more springs stacked on top of one another to provide a single leaf spring). While each one of boards 120, 220, 320, and 420 has been described as a circuit board to which a heat-generating assembly may be electrically coupled and through which opposing anchor portions of opposing springs may be coupled, it is to be understood that each one of boards 120, 220, 320, and 420 may be any suitable structure (e.g., support structure) through which opposing anchor portions of opposing springs of a fastener subassembly may be coupled and which may be positioned on an opposing side of a heat-generating assembly from a heat-dissipating subassembly that may interact with the fastener subassembly.

Figure 5:
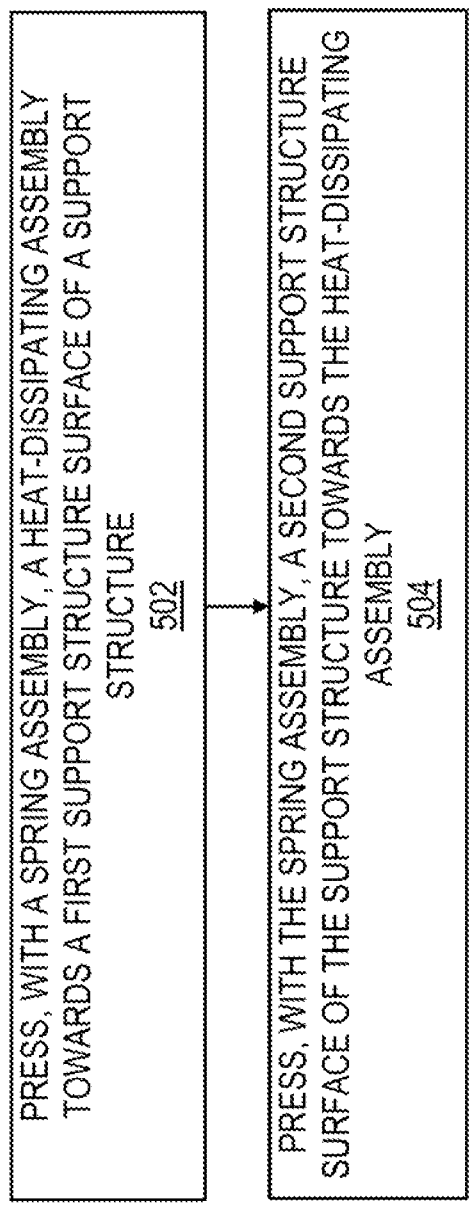
FIG. 5 is a flowchart of an illustrative process for removing heat from a heat-generating assembly.

FIG. 5 is a flowchart of an illustrative process 500 for using a heat-dissipating assembly and a spring assembly to remove heat from a heat-generating assembly that is positioned on a first support structure surface of a support structure that also includes a second support structure surface (e.g., a process for using heat-dissipating subassembly 240 and fastener subassembly 270 to remove heat from heat-generating assembly 210 position on surface 221 of circuit board 220). At operation 502 of process 500, the spring assembly may press the heat-dissipating assembly towards the first support structure surface of the support structure (e.g., top spring 281 may press heat-dissipating subassembly 240 towards top circuit board surface 221 of circuit board 220 (e.g., with force 283$bf$)). At operation 504 of process 500, the spring assembly may press the second support structure surface of the support structure towards the heat-dissipating assembly (e.g., bottom spring 285 may press bottom circuit board surface 229 of circuit board 220 towards heat-dissipating subassembly 240 (e.g., with force 287$bf$)).

It is understood that the operations shown in process 500 of FIG. 5 are only illustrative and that existing operations may be modified or omitted, additional operations may be added, and the order of certain operations may be altered.

While there have been described heat-removal assemblies with springs on opposing sides of a support structure and methods for using the same, it is to be understood that many changes may be made therein without departing from the spirit and scope of the subject matter described herein in any way. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms, such as "up" and "down," "front" and "back," "top" and "bottom" and "side," "above" and "below," "length" and "width" and "thickness" and "diameter" and "cross-section" and "longitudinal," "X-" and "Y-" and "Z-," and the like, may be used herein only for convenience, and that no fixed or absolute directional or orientational limitations are intended by the use of these terms. For example, the components of a heat-removal assembly can have any desired orientation. If reoriented, different directional or orientational terms may need to be used in their description, but that will not alter their fundamental nature as within the scope and spirit of the subject matter described herein in any way.

Therefore, those skilled in the art will appreciate that the concepts of the disclosure can be practiced by other than the described embodiments, which are presented for purposes of illustration rather than of limitation.

What is claimed is:

1. An electronic device comprising:
    a circuit board comprising a first circuit board surface and a second circuit board surface opposite the first circuit board surface;
    a heat-generating assembly positioned on the first circuit board surface; and
    a heat-removal assembly comprising:
        a heat-dissipating subassembly; and
        a fastener subassembly comprising:
            a first spring comprising a first anchor portion and a first contact portion;
            a second spring comprising a second anchor portion and a second contact portion; and
            a coupling mechanism that couples the first anchor portion to the second anchor portion via a circuit board through-hole extending through the circuit board between the first circuit board surface and the second circuit board surface, wherein:
                the first contact portion exerts a first contact force for forcing a portion of the heat-dissipating subassembly towards a portion of the heat-generating assembly;
                the second contact portion exerts a second contact force for forcing a portion of the circuit board towards the heat-dissipating subassembly; and
                the second spring exerts a force that is offset from all forces exerted by the first spring.

2. The electronic device of claim 1, wherein the coupling mechanism couples the first anchor portion to the second anchor portion via the circuit board through-hole and via a heat-dissipating subassembly through-hole extending through a structure of the heat-dissipating subassembly.

3. The electronic device of claim 2, wherein the structure of the heat-dissipating subassembly comprises a heat pipe structure.

4. The electronic device of claim 2, wherein the structure of the heat-dissipating subassembly comprises a heat spreader structure that is thermally coupled to a heat pipe structure of the heat-dissipating subassembly.

5. The electronic device of claim 1, wherein the coupling mechanism does not extend through any structure of the heat-dissipating subassembly.

6. The electronic device of claim 1, wherein the coupling mechanism fastens the first anchor portion to the second anchor portion.

7. The electronic device of claim 1, wherein the coupling mechanism prevents movement of the first anchor portion with respect to the second anchor portion.

8. The electronic device of claim 1, wherein the first anchor portion is not fixed to any portion of the heat-dissipating subassembly.

9. The electronic device of claim 1, wherein the portion of the heat-dissipating subassembly comprises a portion of a heat spreader structure.

10. The electronic device of claim 1, wherein the portion of the heat-dissipating subassembly comprises a portion of a heat pipe structure.

11. The electronic device of claim 1, wherein the second contact force is offset from the first contact force for encouraging crowning of a portion of the electronic device.

12. The electronic device of claim 1, wherein a portion of the first contact force and a portion of the second contact force are linear along an axis that is perpendicular to the second circuit board surface.

13. The electronic device of claim 1, wherein:
the first spring further comprises a third anchor portion such that the first contact portion is between the first and third anchor portions;
the second spring further comprises a fourth anchor portion such that the second contact portion is between the second and fourth anchor portions; and
the fastener subassembly further comprises another coupling mechanism that couples the third anchor portion to the fourth anchor portion via a second circuit board through-hole extending through the circuit board between the first circuit board surface and the second circuit board surface.

14. The electronic device of claim 13, wherein:
the first contact portion is positioned between the first anchor portion and third anchor portion along a linear structure of the first spring; and
the second contact portion is positioned between the second anchor portion and the fourth anchor portion along a linear structure of the second spring.

15. A fastener assembly for pressing a heat-dissipating assembly against a heat-generating assembly that is positioned on a first board surface of a board comprising a through-hole between the first board surface and a second board surface, the fastener assembly comprising:
a first spring structure comprising:
a first spring anchor; and
a first spring contact; and
a second spring structure comprising:
a second spring anchor; and
a second spring contact, wherein:
the second spring anchor is fastened to the first spring anchor through the passageway;
the first spring contact presses the heat-dissipating assembly towards the first board surface; and
the second spring contact presses, along an axis, the second board surface towards the heat-dissipating assembly, wherein the axis is offset from each axis along which the first spring structure presses the heat dissipating assembly towards the first board surface.

16. A fastener assembly for holding a heat-dissipating assembly against a heat-generating assembly that is positioned on a first support structure surface of a support structure comprising a through-hole between the first support structure surface and a second support structure surface of the support structure, the fastener assembly comprising:
a first spring structure comprising:
a first spring anchor; and
a first spring contact;
a second spring structure comprising:
a second spring anchor; and
a second spring contact; and
a coupling mechanism at least partially positioned within the through-hole, wherein:
the coupling mechanism couples the first spring anchor to the second spring anchor;
the first spring contact exerts a first contact force for forcing the heat-dissipating assembly towards the first support structure surface;
the second spring contact exerts a second contact force for forcing the second support structure surface towards the heat-dissipating assembly; and
the second spring contact exerts the second contact force along an axis that does not intersect the first spring structure.

17. An electronic device comprising:
a circuit board comprising a first circuit board surface, a second circuit board surface opposite the first circuit board surface, and a through-hole therebetween;
a heat-generating assembly positioned on the first circuit board surface; and
a heat-removal assembly comprising:
a heat-dissipating subassembly; and
a fastener subassembly for holding the heat dissipating subassembly against the heat generating assembly, the fastener subassembly comprising:
a first spring structure including a first spring anchor, and a first spring contact, and
a second spring structure including a second spring anchor, and a second spring contact; and
a coupling mechanism at least partially positioned within the through-hole couples together the first spring anchor and the second spring anchor such that: (i) the first spring contact exerts a first contact force that compels the heat dissipating assembly towards the first circuit board surface, and (ii) the second spring contact exerts a second contact force that compels the second circuit board surface towards the heat dissipating assembly along an axis that is offset from the first spring structure.

18. The electronic device of claim 17, wherein the first contact force is along a first spring force axis, wherein the first spring force axis is offset from the axis that is offset from the first spring structure.

* * * * *